(12) United States Patent
Ow et al.

(10) Patent No.: US 9,281,109 B2
(45) Date of Patent: Mar. 8, 2016

(54) MAGNETIC ASSEMBLY

(71) Applicant: Apple Inc., Cupertino, CA (US)

(72) Inventors: Florence W. Ow, Burlingame, CA (US); Jeremy C. Franklin, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/643,123

(22) Filed: Mar. 10, 2015

(65) Prior Publication Data

US 2015/0179324 A1  Jun. 25, 2015

Related U.S. Application Data

(63) Continuation of application No. 13/597,250, filed on Aug. 28, 2012, now Pat. No. 9,007,157.

(51) Int. Cl.
*H01F 7/02* (2006.01)
*G06F 1/16* (2006.01)
*H05K 9/00* (2006.01)

(52) U.S. Cl.
CPC .......... *H01F 7/0263* (2013.01); *G06F 1/1626* (2013.01); *H05K 9/0075* (2013.01); *G06F 2200/1634* (2013.01)

(58) Field of Classification Search
CPC ....... H01F 7/0252; H01F 7/0257; H01F 7/02; H01F 7/0205; B23Q 3/1546; B25B 11/002; B25H 1/08; E05C 19/16; E05C 17/56
USPC .................................................. 335/285–306
See application file for complete search history.

(56) References Cited

U.S. PATENT DOCUMENTS

| | | | | |
|---|---|---|---|---|
| 6,653,919 B2 * | 11/2003 | Shih-Chung et al. | ......... | 335/207 |
| 7,541,907 B2 * | 6/2009 | Wang et al. | .................. | 335/305 |
| 7,817,006 B2 * | 10/2010 | Fullerton et al. | .............. | 335/306 |
| 7,839,248 B2 * | 11/2010 | Fullerton et al. | .............. | 335/306 |
| 7,843,297 B2 * | 11/2010 | Fullerton et al. | .............. | 335/306 |
| 8,138,868 B2 * | 3/2012 | Arnold | .......................... | 335/219 |
| 8,531,827 B2 * | 9/2013 | Huang et al. | ............. | 361/679.29 |
| 2005/0023841 A1 * | 2/2005 | Chen | ........................ | 292/251.5 |
| 2007/0133156 A1 * | 6/2007 | Ligtenberg et al. | ............ | 361/681 |
| 2007/0182517 A1 * | 8/2007 | Humphries et al. | .......... | 335/306 |
| 2008/0139261 A1 * | 6/2008 | Cho et al. | ................... | 455/575.4 |
| 2012/0068798 A1 * | 3/2012 | Lauder et al. | ................. | 335/306 |
| 2012/0146752 A1 * | 6/2012 | Fullerton et al. | .............. | 335/306 |

* cited by examiner

*Primary Examiner* — Mohamad Musleh
(74) *Attorney, Agent, or Firm* — Downey Brand LLP

(57) ABSTRACT

A magnetic assembly for use in a housing of an electronic device can include a first and a second magnet and a magnetic shield. The magnetic shield can reduce magnetic flux density from the first and the second magnets that can appear on the outside of the housing. A magnetic hinge assembly can include magnets configured to correlate with the first and second magnets. The magnetic hinge can magnetically attach to the housing by cooperating with the first and second magnets with magnets that can be included in the magnetic hinge.

16 Claims, 11 Drawing Sheets

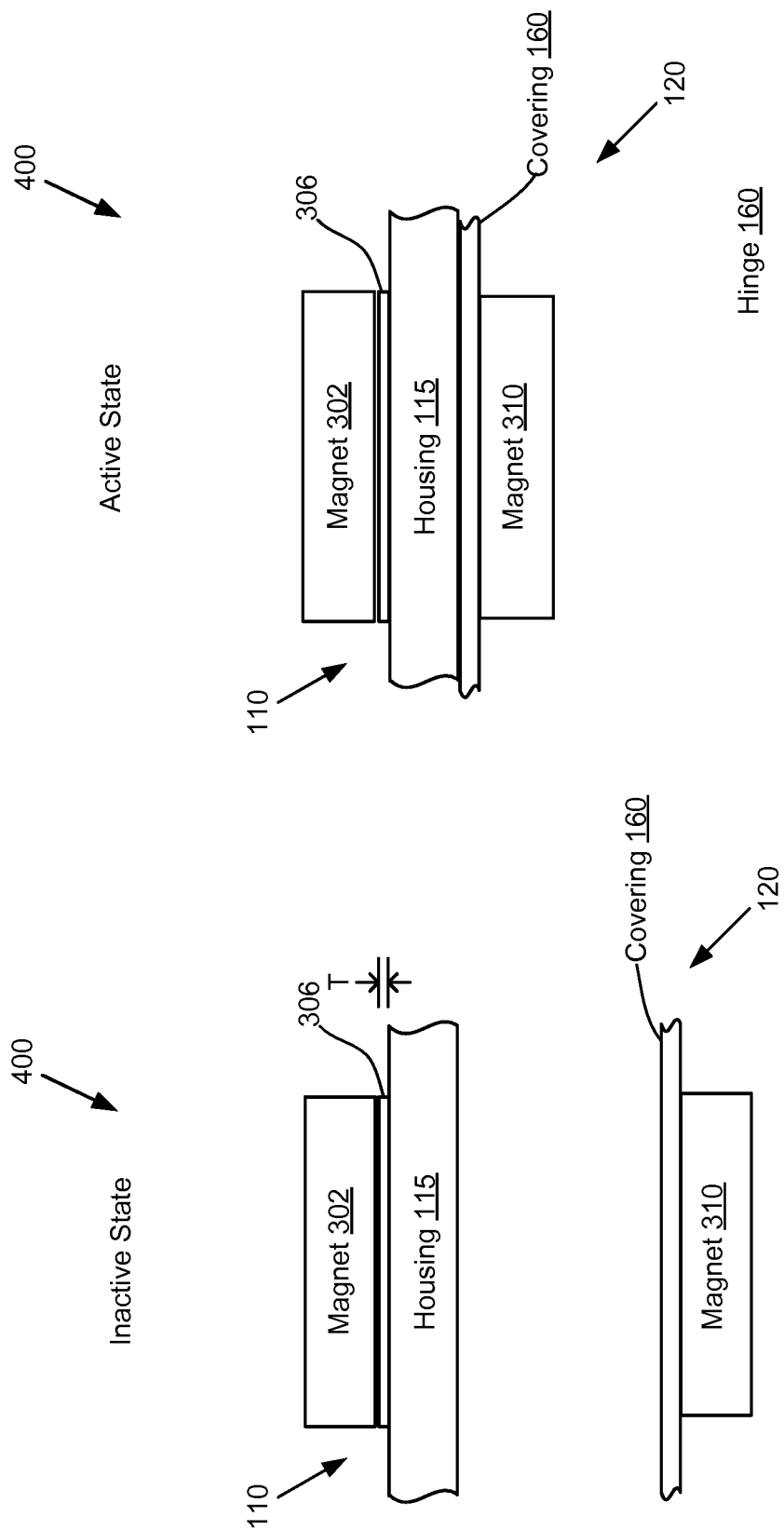

Buffer Configuration

Buffer Configuration

MAGNETIC ASSEMBLY

CROSS-REFERENCE TO RELATED APPLICATIONS

This application is a continuation of U.S. application Ser. No. 13/597,250, filed Aug. 28, 2012, entitled "MAGNETIC ASSEMBLY", the contents of which are incorporated herein by reference in their entirety for all purposes.

FIELD

The described embodiments generally relate to portable electronic devices. More particularly, the present embodiments describe various releasable attachment techniques well suited for portable electronic devices.

BACKGROUND

Recent advances in portable computing includes the introduction of hand held electronic devices and computing platforms along the lines of the iPad™ tablet manufactured by Apple Inc. of Cupertino, Calif. These handheld computing devices can be configured such that a substantial portion of the electronic device takes the form of a display used for presenting visual content leaving little available space for an attachment mechanism that can be used for attaching an accessory device.

Conventional attachment techniques generally rely upon mechanical fasteners that typically require at least an externally accessible attaching feature on the electronic device to mate with a corresponding attaching feature on the accessory device. The presence of the external attaching feature can detract from the overall look and feel of the handheld computing device as well as add unwanted weight and complexity as well as degrade the appearance of the hand held computing device Therefore, a mechanism for releasably attaching together at least two objects is desired.

SUMMARY

This paper describes various embodiments that relate to a system and apparatus for releasably attaching an accessory to an electronic device.

A multi-state magnetic assembly suitable for releasably attaching an accessory device to a housing of an electronic device can include a first magnet, with a surface shaped to conform with an interior surface of the housing and providing a first magnetic field and having a first polarity, a second magnet with a surface shaped to conform to an interior surface of the housing providing a second magnetic field and having a second polarity and a magnetic attractor block positioned between the first and the second magnets where the attractor block can reduce a magnetic flux density at an exterior surface of the housing. The multi-state magnetic assembly can also include a magnetic shield made from a ferrous material having a first surface attached to the interior surface of the housing and having a second surface attached to the first and second magnets. The second surface of the magnetic shield can have a shape conforming to the surface shapes of the first and second magnets. In an inactive state, the first magnetic shield in cooperation with the magnetic attractor block can maintain a first magnetic flux density at the outer surface of the housing below a value that is capable of adversely affecting magnetically sensitive device. In an active state, a second magnetic flux density is maintained at the outer surface of the housing that exceeds a value being suitable for forming a magnetic attachment.

A magnetic attachment system can include a non-ferrous housing, a first magnetic assembly near a first edge of a housing, the magnetic assembly comprising a first and a second shaped magnet where each magnet can be arranged in a particular polarity orientation and each magnet can provide a magnetic field, a magnetic attractor block positioned between the first and the second magnets where the magnetic attractor block can reduce magnetic flux density at the outer surface of the housing, and a magnetic shield positioned between the first and second magnets and the housing. The magnetic attachment system can include a magnetic hinge assembly including a first group of magnets arranged to correlate with the polarity of the first and second magnets in the magnetic assembly. The first group of magnets can provide a third magnetic field. In an inactive state, the magnetic flux density value at an exterior surface of the housing can be less than an amount that can affect a magnetically sensitive device. In an active state, the third magnetic field is brought into proximity to the first and the second magnetic fields, wherein the magnetic fields operate to provide a magnetic flux density value at the exterior surface of the housing suitable for providing a magnetic attachment between the magnetic hinge assembly and the housing.

A portable electronic device can include a housing and a multi-state magnetic attachment system. The multi-state magnetic attachment system can include a magnetic sub-assembly that can include a first magnet with a first surface that can be shaped to conform to an interior portion of the housing and provide a first magnetic field. The magnetic sub-assembly can also include a second magnet having a first surface shaped to conform to the interior portion of the housing and provide a second magnetic field. The multi-state magnetic attachment system can also include a magnetic shield attached to the first and the second magnets and having a shape that also conforms to the interior portion of the housing and a magnetic hinge assembly that can include a third and a fourth magnet providing a third and a fourth magnetic fields. In an inactive state, the magnetic shield can affect magnetic flux from the first and the second magnetic fields such that a magnetic flux density value at an exterior surface of the housing is less than an amount that can substantially affect a magnetically sensitive device. In an active state, the third and fourth magnetic fields are brought into proximity of the first and second magnetic fields and the first, second, third and fourth magnetic fields operate to provide a magnetic flux density at an exterior of the housing suitable for forming a magnetic attachment between the magnetic hinge assembly and the housing.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIGS. 4A-4B illustrate inactive and active states of attachment of a magnetic attachment feature between a tablet device and a cover assembly.

DETAILED DESCRIPTION

Figure 1A:
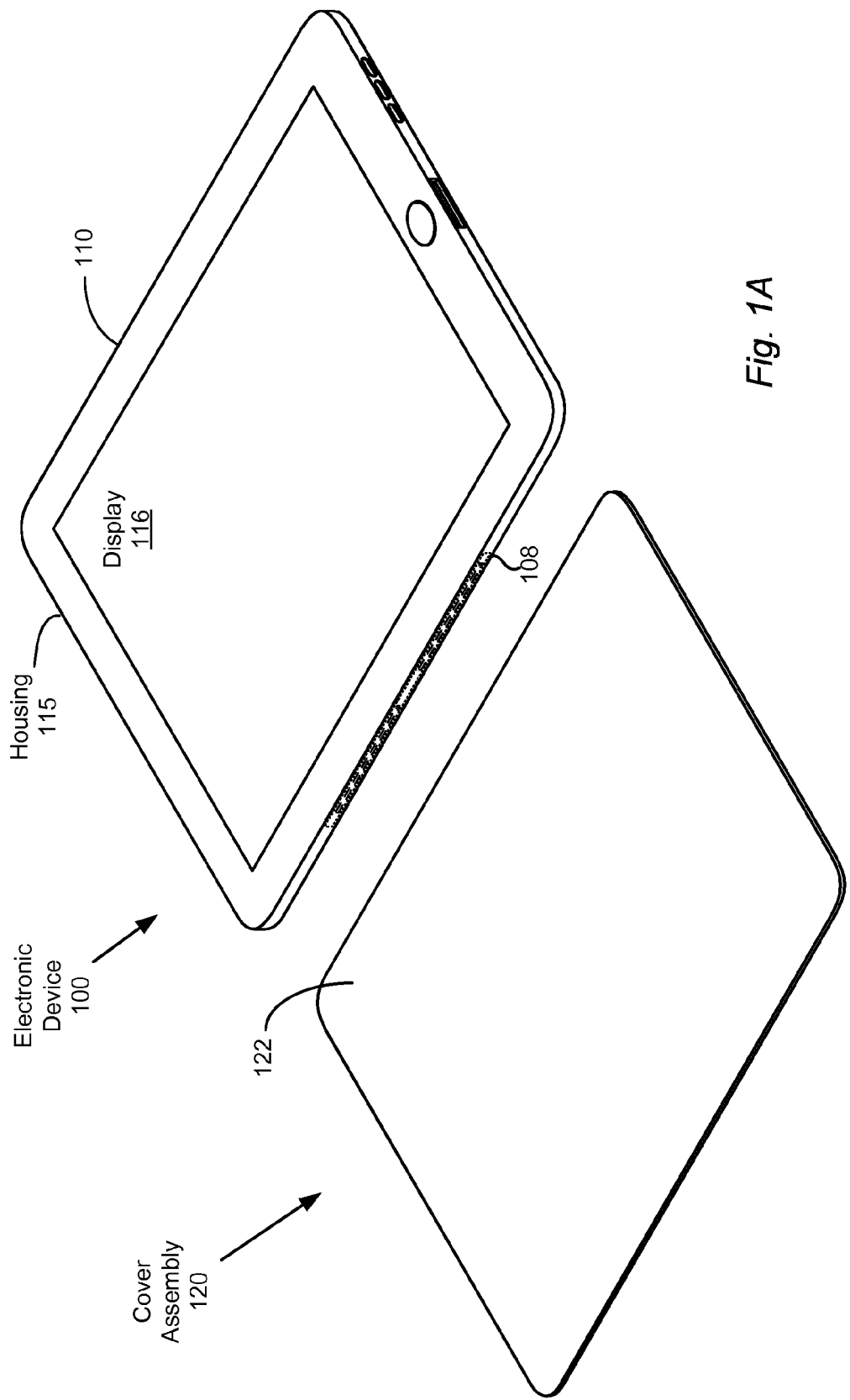
FIGS. 1A-1B show an electronic and a cover assembly each in perspective top views in accordance with an embodiment described in the specification.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The following description relates in general to a mechanism that can be used to attach together at least two suitably configured objects. In one embodiment, this can be accomplished without the use of conventional fasteners. Each of the objects can include an attachment feature arranged to provide a magnetic field having appropriate properties. When the attachment features are brought into proximity with each other, the magnetic fields can cooperatively interact based upon their respective properties, resulting in the objects magnetically attaching to each other in a desired and repeatable manner. For example, due at least in part to the cooperative nature of the interaction of the magnetic fields, the objects can attach to each other in a pre-determined position and relative orientation without external intervention. For example, the cooperative magnetic interaction can result in the objects self-aligning and self-centering in a desired orientation.

The objects can remain in the magnetically attached state if and until a releasing force of sufficient magnitude is applied that overcomes the overall net attractive magnetic force. Connectors such as mechanical fasteners are not required to attach the objects together. Furthermore, to prevent undue interference to the magnetic interaction between the magnetic attachment features, at least a portion of the objects in the vicinity of the magnetic attachment features can be formed of magnetically inactive materials such as plastic or non-ferrous metals such as aluminum or non-magnetic stainless steel The objects can take many forms and perform many functions. When magnetically attached to each other, the objects can communicate and interact with each other to form a cooperative system. The cooperating system can perform operations and provide functions that cannot be provided by the separate objects individually. In another embodiment, at least one device can be used as an accessory device. The accessory device can be magnetically attached to at least one electronic device. The accessory device can provide services and functions that can be used to enhance the operability of the electronic device(s). For example, the accessory device can take the form of a protective cover that can be magnetically attached to the electronic device. The protective cover can provide protection to certain aspects (such as a display) of the electronic device while enhancing the overall look and feel of the electronic device. The magnetic attachment mechanism used to magnetically attach the accessory and the electronic device can assure that the cover can only attach to the electronic device in a specific orientation. Moreover, the magnetic attachment mechanism can also assure proper alignment and positioning of the protective cover and the electronic device.

The protective cover can include at least a hinge portion. The hinge portion can be magnetically attached to the electronic device using a magnetic attachment feature. The hinge portion can be pivotally connected to a flap that can be placed upon a portion of the electronic device to be protected. The protective cover can include electronic circuits or other elements (passive or active) that can cooperate with electronic elements in the electronic device.

Figure 1B:
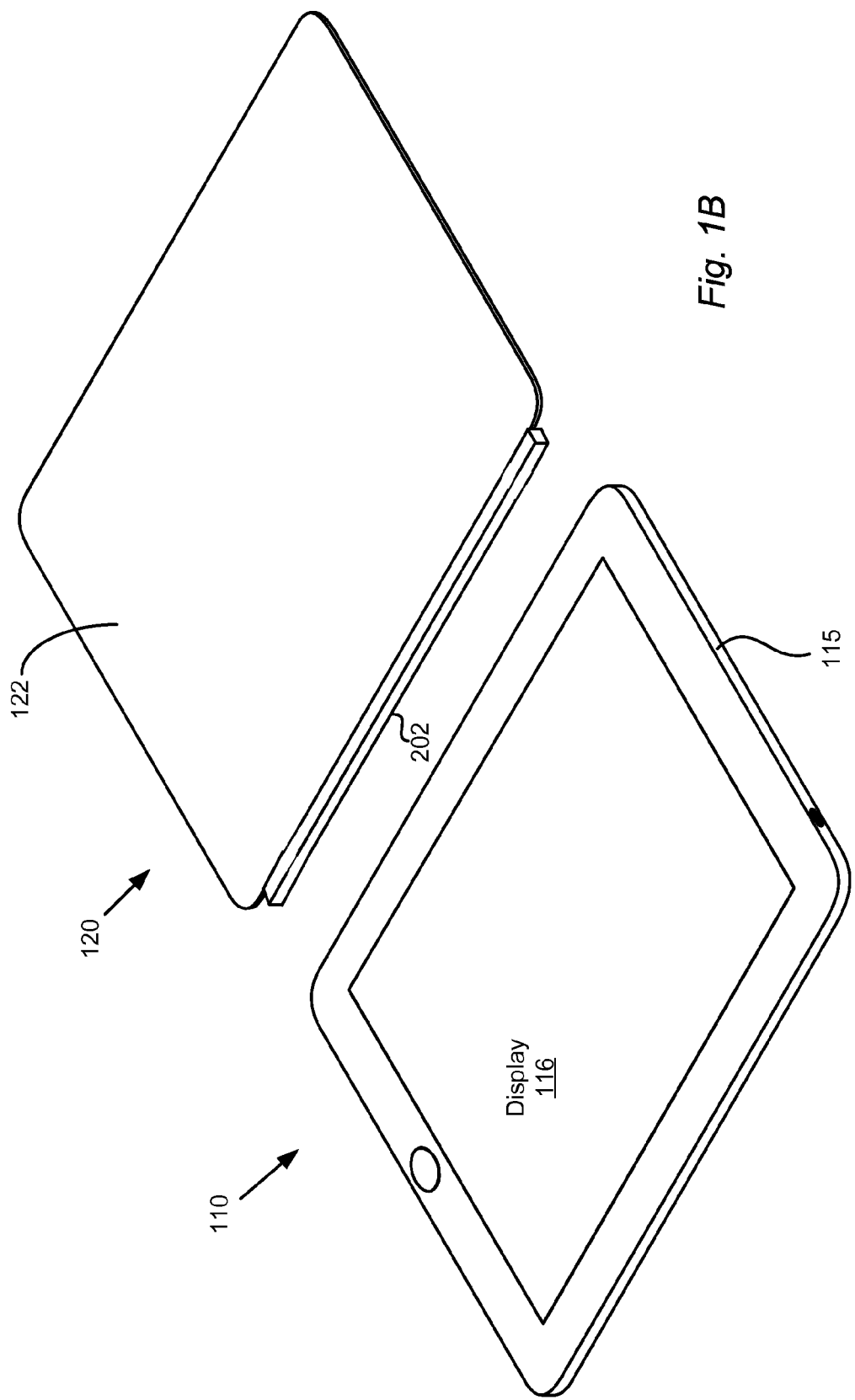

The remainder of this discussion will describe particular embodiments of devices that can use the magnetic attachment system. In particular, FIGS. 1A-1B show electronic device 100 presented in terms of tablet device 110 and accessory device is shown as cover assembly 120 each in perspective top views. Electronic device 100 can also take the form of other portable electronic devices. In some examples, the table device 110 can include housing 115. Housing 115 can enclose and provide support for components of the tablet device 110. Housing 115 can also provide support for at least a large and prominent display 116 occupying a substantial portion of a front face of the tablet device 110. In one embodiment, housing 115 can be formed from non-ferrous material, such as aluminum, a polymer, fiber impregnated resin, non-magnetic stainless steel or the like. The display 116 can be used to present visual content. The visual content can include still images, visual, textual data, as well as graphical data that can include icons used as part of a graphical user interface, or GUI.

Cover assembly 120 can have a look and feel that complements that of the tablet device 110 adding to overall look and feel of tablet device 110. Cover assembly 120 is shown in FIGS. 1A-1B attached to tablet device 110 in an open configuration in which display 116 is fully viewable. Cover assembly 120 can include flap 122. In one embodiment, flap 122 can have a size and shape in accordance with display 116. Flap 122 can be pivotally connected to magnetic attachment feature by way of a hinge assembly (not shown). A magnetic attachment force between cover assembly 120 and magnetic attachment area 108 can maintain cover assembly 120 and tablet device 110 in a proper orientation and placement vis-a-vis flap 122 and display 116. By proper orientation it is meant that cover assembly 120 can only properly attach to tablet device 110 having flap 122 and display 116 aligned in a mating engagement. The mating arrangement between display 116 and flap 122 is such that flap 122 covers substantially all of display 116 when flap 122 is placed in contact with display 116 as shown in FIG. 2A below.

FIG. 1B shows tablet device 110 and cover assembly 120 rotated about 180° to provide a view of covering 160 and its relationship with cover assembly 120. In one embodiment, covering 160 can comprise cloth. In another embodiment, covering 160 can comprise a label or other thin and relatively non-ferrous material. In one embodiment, covering 160 can act as at least a portion of a hinge assembly and allow cover assembly 120 to pivot about housing 115.

Figure 2A:
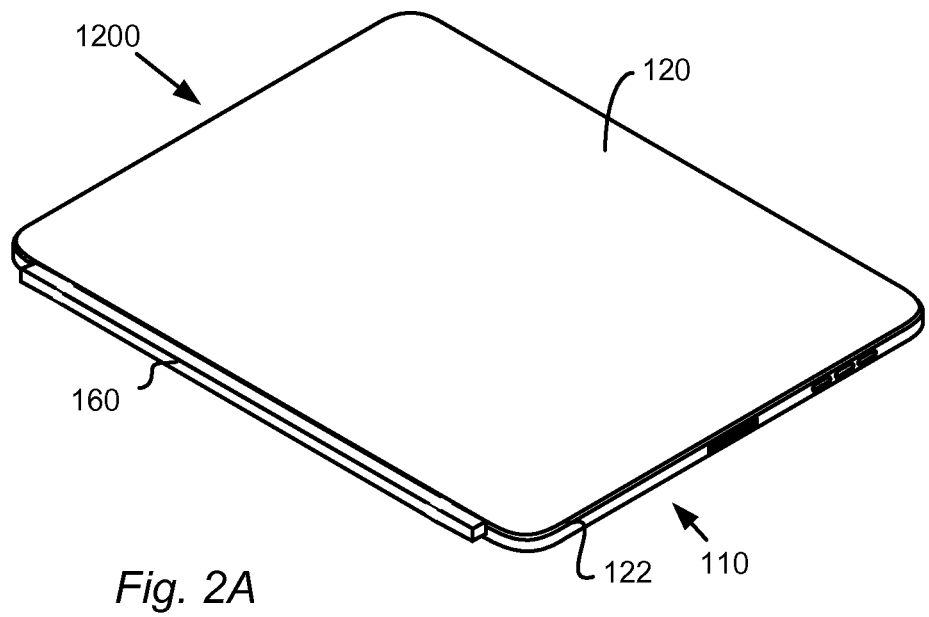
FIGS. 2A-2B show a cover assembly and tablet device magnetically attached to each other.
Figure 2B:
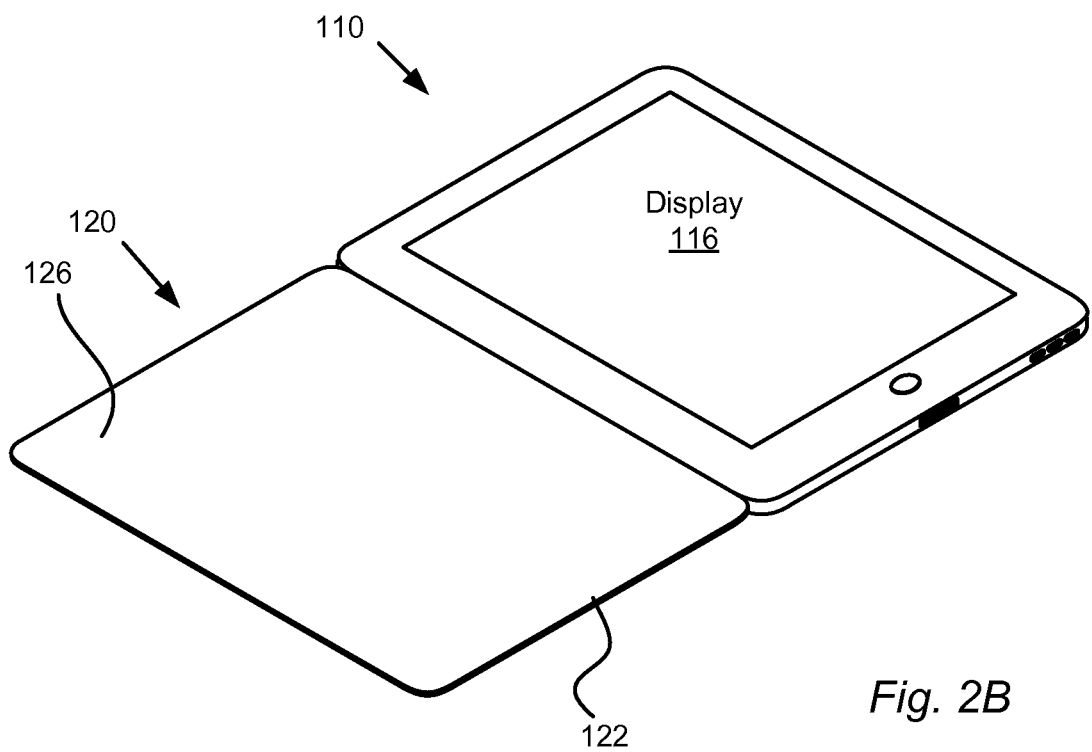

FIGS. 2A-2B show cover assembly 120 and tablet device 110 magnetically attached to each other. FIG. 2A shows a closed configuration in which display 116 is fully covered by and in contact with cover flap 122. Cover assembly 120 can pivot about covering 160 from the closed configuration of FIG. 2A to an open configuration of FIG. 2B. In the closed configuration, inner layer 126 of cover assembly 120 can come in direct contact with display 116. In a particular embodiment, inner layer 126 can be formed of a microfiber material.

Figure 3A:
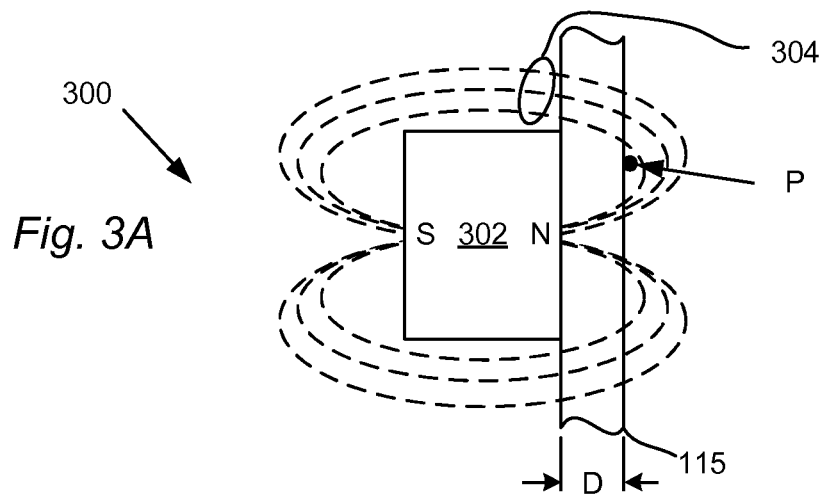
FIGS. 3A-3C are diagrams showing flux interactions between a magnet and surrounding elements in accordance with one embodiment described in the specification.
Figure 3B:
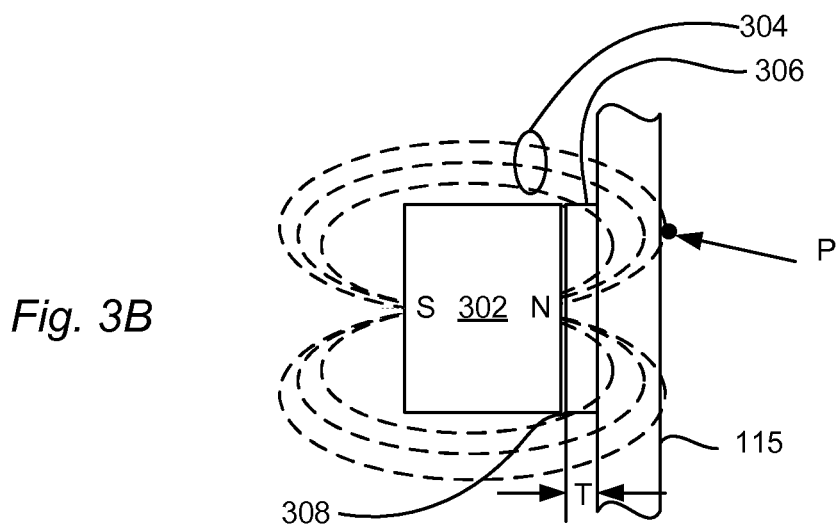
Figure 3C:
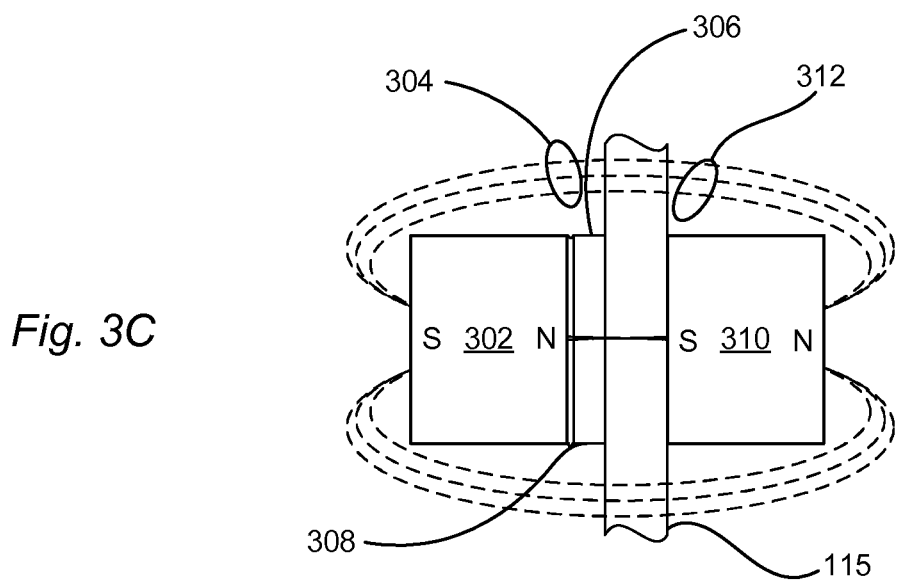

FIGS. 3A-3C are diagrams showing magnetic flux interactions between a magnet 302 and surrounding elements in accordance with an embodiment described in the specification. FIG. 3A shows magnet 302 disposed next to a section of housing 115. In one embodiment, housing 115 can be a non-ferrous material allowing magnetic flux to easily penetrate housing 115. Unfortunately, amounts of magnetic flux that can appear outside housing 115 can exceed a predetermined amount such that the magnetic flux 304 (shown as flux lines) can become a nuisance. For example, if a magnetic flux density related to magnetic flux 304 becomes greater than a threshold, then adverse effects can occur on magnetically sensitive devices such as credit cards, mechanical watches, magnetic compasses or the like.

Point P can represent a point on the outside of housing 115. The magnetic flux density measured at point P should be less than a threshold $B_{threshold}$, where $B_{threshold}$ can represent a magnetic flux density value below which magnetically sensitive devices (such as a magnetic strip on a credit card) can remain substantially unaffected. As shown in FIG. 3A, magnetic flux 304 is not impeded or reduced by housing 115, (especially when housing 115 is non-ferrous). In one embodiment, housing 115 thickness D may not provide enough distance between point P and magnet 302 such that the magnetic flux density can be reduced to an amount less than $B_{threshold}$.

FIG. 3B shows magnet 302 and housing 115 with magnetic shield 306 positioned between housing 115 and magnet 302. In one embodiment, magnetic shield 306 can be attached to magnet 302 with an adhesive 308. Magnetic shield 306 can be a thin ferrous material that can attract and contain magnetic flux from magnet 302 by offering a low resistance flux path for magnetic flux, particularly when compared to the resistance of a magnetic flux path in air. In one embodiment, material for magnetic shield 306 can be any ferrous material. In another embodiment, magnetic shield 306 can be a ferrous material with a relatively high magnetic permeability such as low carbon steel or Mu metal (an alloy of nickel, steel and molybdenum) or any other technically feasible material. In one embodiment, magnetic shield 306 can be a thickness T such that the magnetic shield 306 in conjunction with thickness D of housing 115 can reduce magnetic flux density at point P to an amount less than $B_{threshold}$. In one embodiment, magnetic flux 304 can be substantially or partially contained within magnetic shield 306. In yet another embodiment, magnetic flux 304 can saturate magnetic shield 306.

FIG. 3C shows magnet 302, magnetic shield 306 and housing 115. Adhesive 308 can attach magnetic shield 306 to magnet 302. In this figure, a second magnet 310 is positioned adjacent to the outside of housing 115. Magnet 302 and magnet 310 can be attracted together, despite reduced magnetic flux 304 appearing outside housing 115. In one embodiment, magnetic flux 304, although reduced by magnetic shield 306, can still pass through housing and interact with magnet 310. Thus, when magnet 310 is brought into proximity of magnet 302, magnet 302 and magnet 310 can attract each other as illustrated here.

In one embodiment, FIG. 3B can illustrate an inactive state when cover assembly 120 is not pivotably attached to housing 115 of tablet device 110. FIG. 3C can illustrate an active state when cover assembly 120 is pivotably attached to housing 115 by a magnetic attraction between magnet 302 within housing 115 and magnet 310 included in cover assembly 120.

FIGS. 4A-4B illustrate inactive and active states of attachment of a magnetic attachment feature 400 between tablet device 110 and cover assembly 120. FIG. 4A shows magnetic attachment feature 400 in an inactive attachment state. Magnet 302 can be attached to magnetic shield 306 that can be positioned adjacent to housing 115 of tablet device 110. Magnetic shield 306 of thickness T can attract and contain or partially contain magnetic flux from magnet 302 by offering a low resistance path for magnetic flux to travel compared to the resistance path for magnetic flux through the air.

Cover assembly 120 can include second magnet 310 located next to covering 160. Since housing 115 is separated from cover assembly 120, magnetic flux 304 from magnet 302 can be contained, or partially contained in magnetic shield 306. In the inactive state, a large separation distance between housing 115 and covering 160 can prevent magnetic attraction between magnet 302 and magnet 310. In one embodiment, some magnetic flux 304 can be present on an outer surface of housing 115.

FIG. 4B shows magnetic attachment feature 400 in an active state. Housing 115 can be placed in close proximity to cover assembly 120, more particularly to covering 160. In the active attachment state, magnetic flux 312 from magnet 310 and magnetic flux 304 from magnet 302 can interact and allow magnet 310 and magnet 302 to attract each other. In the active attachment state, magnets 302 and 310 can create a magnetic coupling between cover assembly 120 which includes covering 160 and housing 115. In one embodiment, cover assembly 120 can be pivotably couple to housing 115 through the magnetic attachment feature 400 while the magnetic attachment feature 400 is in the active attachment state. In one embodiment, the magnetic shield 306 may not affect a level of attraction from the perspective of a user.

Figure 5:
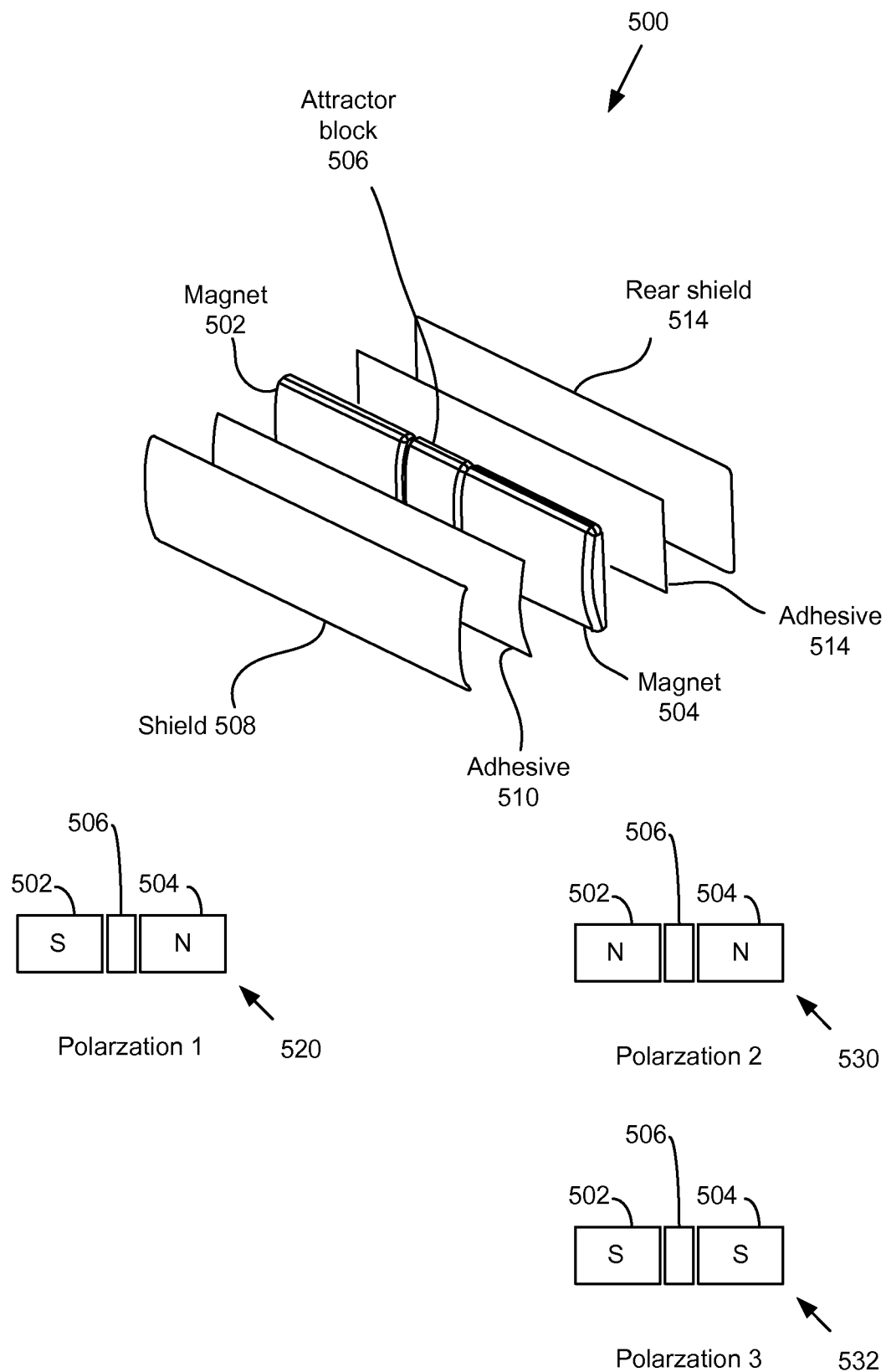
FIG. 5 is an exploded view of a magnetic assembly in accordance with an embodiment described in the specification.

FIG. 5 is an exploded view of magnetic assembly 500 in accordance with an embodiment described in the specification. Magnetic assembly 500 can include a first magnet 502, a second magnet 504 and an attractor block 506 positioned between first and second magnets 502 and 504. In one embodiment, attractor block 506 can be a formed from a ferrous material and can reduce the magnetic flux density at a point on the surface of housing 115. Polarization option 1 520 is shown in FIG. 5 where magnet 502 can be attracted to magnet 504.

In another embodiment, attractor block 506 can allow magnet 502 and magnet 504 to be positioned in proximity to each other when a polar configuration of magnets 502 and 504 is such that magnetic poles within magnet 502 and magnet 504 repel each other. Polarization option 2 530 and polarization option 3 532 show two exemplary orientations when magnet 502 and magnet 504 can repel each other from their ends.

In one embodiment, magnetic shield 508 can formed from a ferrous material and can be attached to magnets 502, 504 and attractor block 506 with adhesive 510. Adhesive 510 can be pressure sensitive adhesive, a thermally curable adhesive, a rigid or semi-rigid epoxy, a urethane adhesive or any other technically feasible adhesive. Magnetic assembly 500 can also include a rear shield 512 coupled to magnets 502 and 504, disposed on a side of magnets 502 and 504 in opposition to magnetic shield 508. In one embodiment, rear shield 512 can be formed from a ferrous material. In another embodiment, rear shield 512 can be formed from a non-ferrous material. In some arrangements, rear shield 512 can provide structural support. If the rear shield is formed from ferrous material, then rear shield can reduce magnetic flux from magnets 502 and 504 that may interfere with some operations of other components such as a compass and the like. In one embodiment, rear shield 512 can be attached to magnet 502 and magnet 504 with adhesive 514. In one embodiment, adhesive 514 can be similar to adhesive 510.

Figure 6:
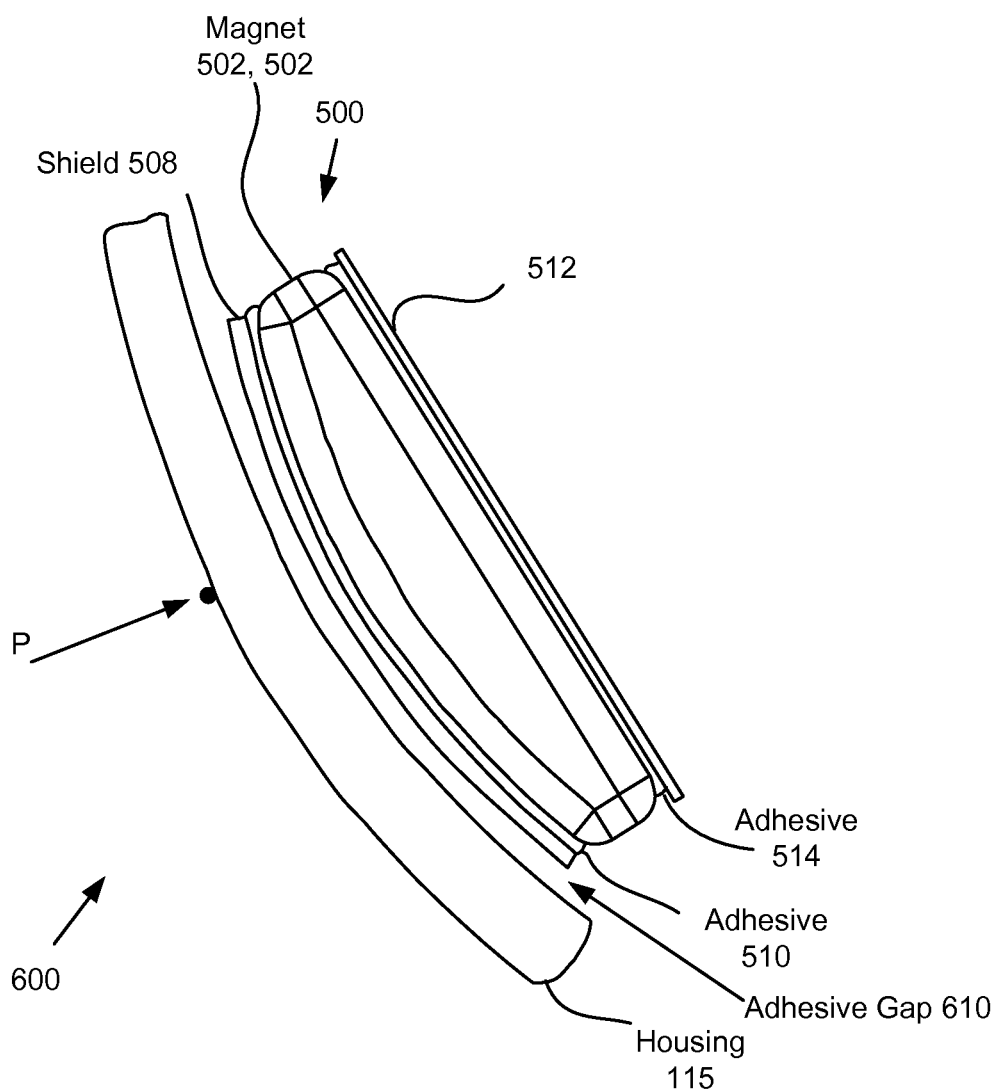
FIG. 6 is a side view of magnetic assembly and housing in accordance with an embodiment described in the specification.

FIG. 6 is a side view 600 of magnetic assembly 500 and housing 115 in accordance with an embodiment described in the specification. Magnetic assembly 500 can include magnets 502, 504, magnetic shield 508 and rear shield 512. Adhesive 510 can attach magnetic shield 508 to magnets 502 and 504. Adhesive 514 can bond rear shield 512 to magnets 502 and 504. In the inactive state, magnetic flux density measured at point P can be less than $B_{threshold}$ as described above in conjunction with FIGS. 3A-3C.

At least one portion of magnets 502 and 504 can be shaped to closely match or conform to a portion of housing 115. Matching the shape of magnets 502 and 504 to housing 115 can enable the positioning of magnets 502 and 504 to be relatively close to an inside edge of housing 115. In one embodiment, magnets 502 and 504 can conform relatively closely to housing 115 and can reduce any gaps between magnets 502 and 504 and any external magnets that can be included in a cover assembly 120 (not shown) in order to maximize a magnetic force between magnets 502 and 504 with magnets in cover assembly 120. Since magnetic shield 508 can be relatively thin, compared to housing 115 and magnets 502 and 504, magnetic shield 508 can be shaped to conform to housing 115, magnets 502 and 504 or both.

Figure 7A:
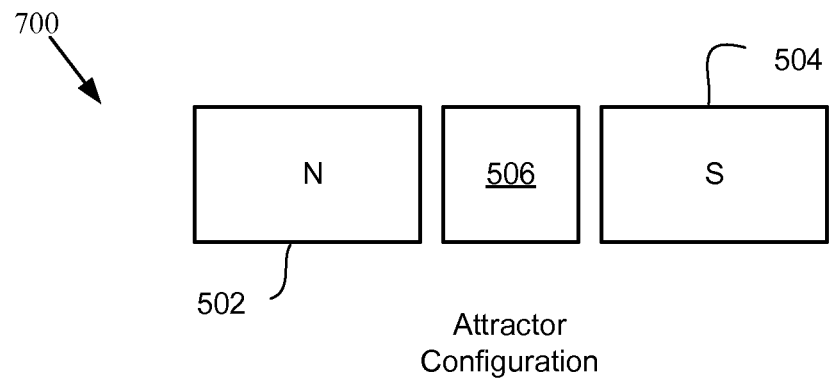
FIGS. 7A-7D are simplified block diagrams of a magnetic assembly in accordance with an embodiment described in the specification.
Figure 7B:
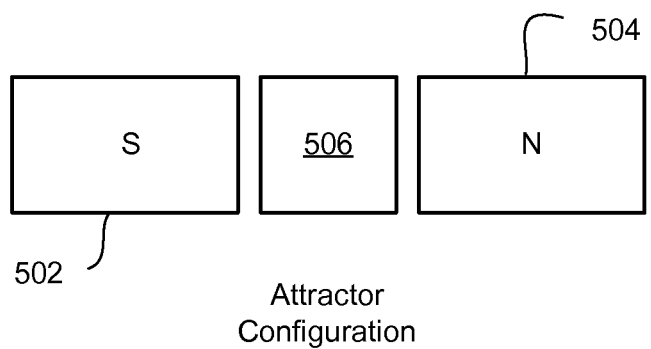

FIGS. 7A-7D are simplified block diagrams 700 of magnetic assembly 500 in accordance with an embodiment described in the specification. FIG. 7A in particular shows an attractor configuration with attractor block 506 positioned between magnet 502 and magnet 504. In one embodiment, attractor block 506 can be formed from a ferrous material. Magnet 502 can have a magnetic north pole positioned as shown. Magnet 504 can have a relatively opposite polar orientating a magnet south pole positioned as shown. In this configuration, attractor block 506 can reduce flux density at a surface of housing 115. FIG. 7B is a similar attractor configuration with simply swapping positions of the north and south poles.

Figure 7C:
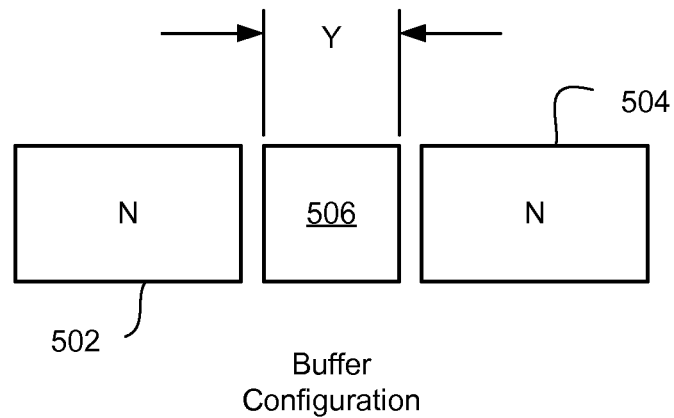
Figure 7D:
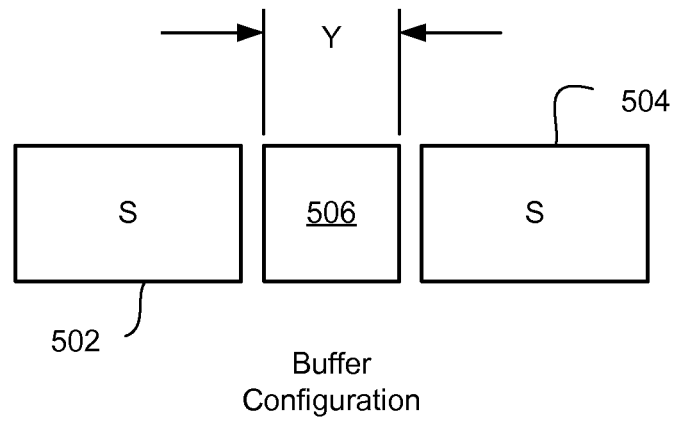

FIG. 7C shows a buffer configuration with attractor block 506 positioned between magnets 502 and 504, however in this example, magnets 502 and 504 are configured to have a similar polar orientation. As shown, the magnetic north pole of magnet 502 is adjacent to the magnetic north pole of magnet 504. In this configuration, magnet 502 can seek to repel magnet 504 on its end with a repulsive magnetic force. Attractor block 506 can be configured to allow magnet 502 to be positioned near magnet 504 despite repulsive magnetic forces. In one embodiment, an attractor block 506 can have thickness Y such that magnets 502 and 504 can couple to the ferrous attractor block 506 reducing or eliminating repulsive magnetic forces between magnets 502 and 504. FIG. 7D shows another embodiment of a buffer configuration, but in this embodiment magnetic south pole of magnet 502 is adjacent to magnetic south pole of magnet 504.

Figure 8:
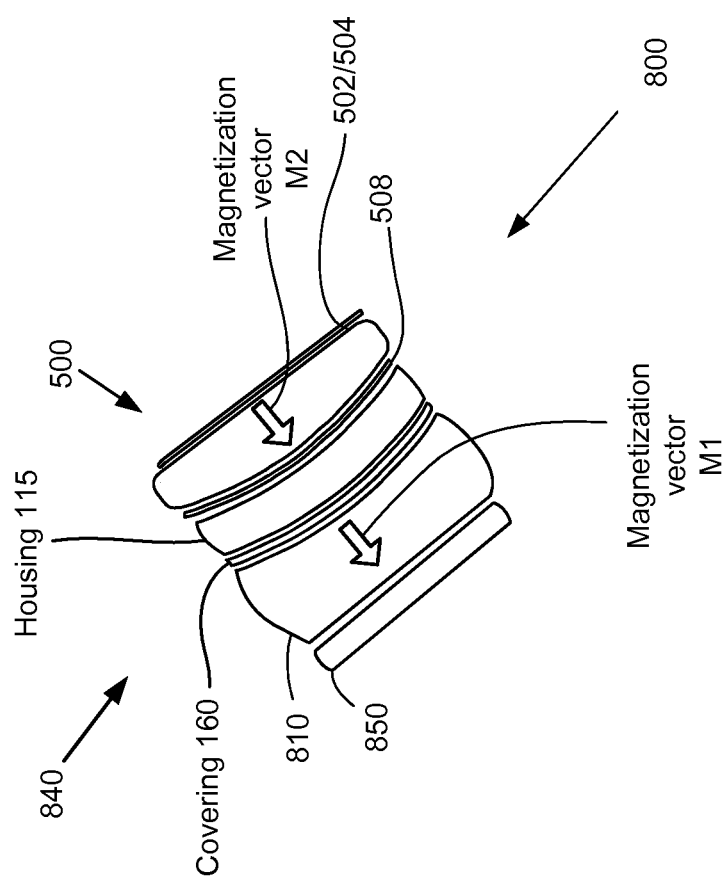
FIG. 8 is a schematic diagram of a cross sectional view of a magnet in a hinge assembly magnetically coupled to housing in accordance with an embodiment described in the specification.

FIG. 8 is a schematic diagram of a cross sectional view 800 of a magnet 810 adjacent to covering 160 magnetically coupled to housing 115 in accordance with an embodiment described in the specification. More particularly, FIG. 8 shows a simplified magnetic attachment system 840 comprising covering 160 and a housing 115 operating in an active state. In the active state, magnets 810 that can be positioned within or on covering 160 can be attracted to one or more magnetic assemblies 500 located with housing 115 causing covering 160 to magnetically attach to housing 115. In one embodiment, housing 115 can include display 116. In the active state, magnetic flux from magnet 810 and magnets 502 and 504 can over saturate magnetic shield 508 and allow a magnetic attraction between magnets 810 and magnets 502 and 504.

Magnetization vectors can indicate a magnetic force or attraction from a magnet. Magnet 810 in covering 160 can have a magnetization vector M1, while magnetic assembly 500 can have a magnetization vector M2. Positioning of magnet 810 and magnetic assembly 500 can configure magnetization vectors M1 and M2 to be relatively normal to the covering 160 and the housing 115 respectively. An additional magnetic shield 850 can be disposed on a portion of magnet 810. In one embodiment, additional magnetic shield 850 can reduce magnetic flux in an area beyond magnetic shield 850.

Figure 9:
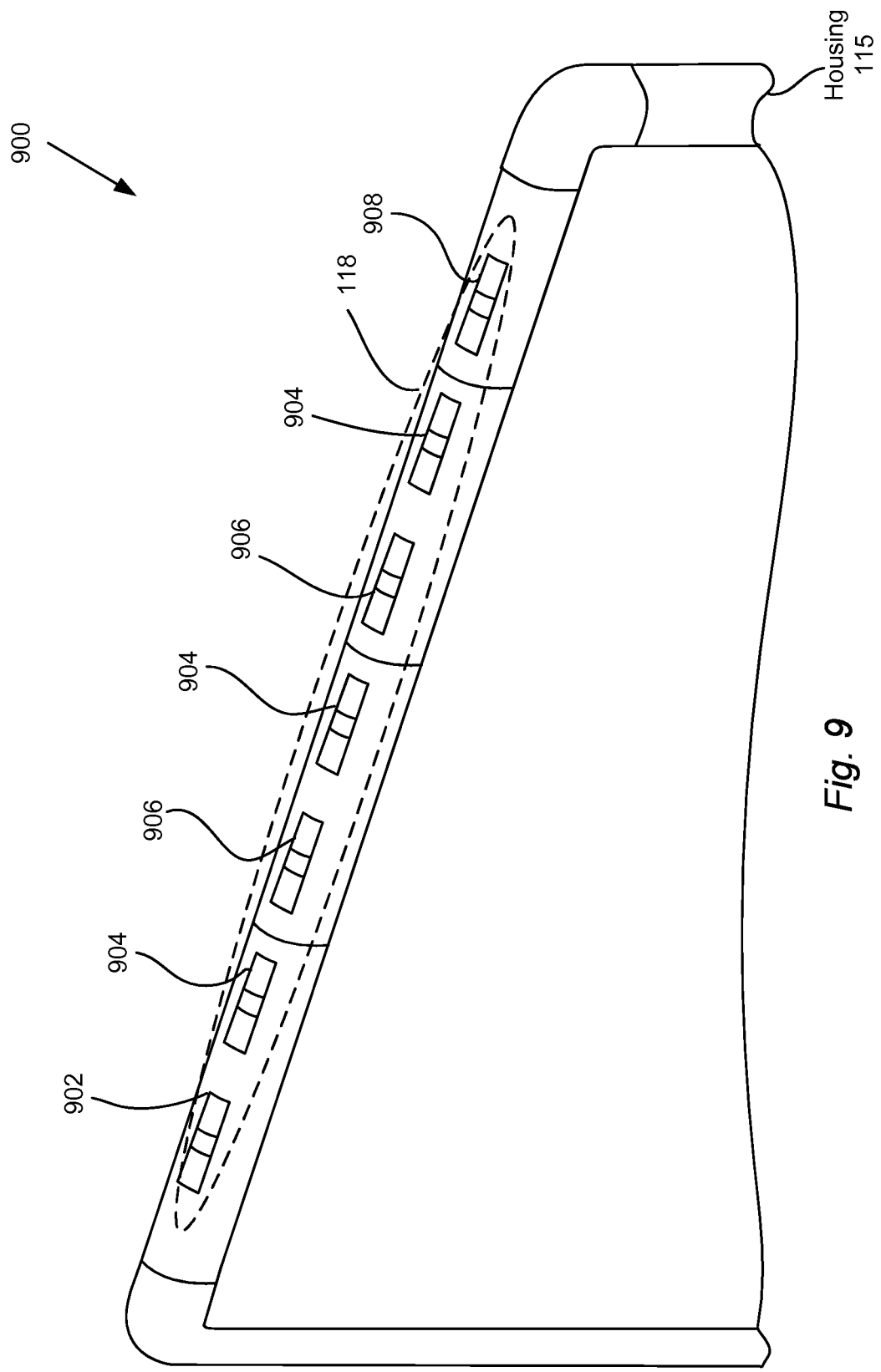
FIG. 9 is a perspective view of an exemplary housing including a plurality of magnetic assemblies in accordance with an embodiment described in the specification

FIG. 9 is a perspective view 900 of a housing 115 including a plurality of magnetic assemblies 500 in accordance with an embodiment described in the specification. In this example, housing 115 can be a housing for tablet computer 110. The plurality of magnetic assemblies 500 can be arranged along an axis (linearly in this example) of housing 115. As described above, the first and second magnets included in each magnetic assembly 500 can have a polarity orientation. Exemplary polar orientation is shown in FIGS. 7A-7D. In other embodiments, other polarity orientations can be possible.

Magnetic assemblies 500 can be configured to have varying polarity orientations to help assure proper alignment of cover assembly 120 attached to housing 115 through covering 160 and magnetic attachment area 108 (shown with a dashed line). Magnetic assembly 902 can be one embodiment of magnetic assembly 500 configured in a buffer assembly, such as FIG. 7A or 7B. In turn, each magnetic assembly included in housing 115 can have one of the four polar orientations shown in FIGS. 7A-7D. Magnetic assembly 904 can be configured to have a polar orientation of FIG. 7B, magnetic assembly 906 can be configured to have a polar orientation of FIG. 7C and magnetic assembly 908 can be configured to have a polar orientation of FIG. 7D.

Arranging particular configurations of magnetic assemblies 902-908 within housing 115 can help control alignment of cover assembly 120 with respect to housing 115. Magnets included in or next to covering 160 can be configured to correlate with the polarity orientations of magnets in magnetic assemblies 902-908. For example, to couple with magnets in magnetic assembly 902, magnets can be arranged in a configuration similar to magnetic assembly 908 and included in covering 160 at a position in covering 160 to substantially align cover assembly 120 to housing 115. Similarly, complimentary magnetic arrangements for other magnetic assemblies 904-908 in housing 115 can be provided in covering 160. The magnets within or adjacent to covering 160 can couple to magnets in magnetic attachment area 108 such that the position of covering 160 can be determined, at least in part, by the configuration of magnet polarities and positions of magnets within covering 160. Thus, magnets in covering 160 and housing 115 can cooperate to attach, self-align and self-center cover assembly 120 in a desired orientation.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed:

1. A multi-state magnetic unit attachable to an interior surface of a housing of an electronic device and operable to magnetically attach an object having a triggering magnetic element to an exterior surface of the housing at a predetermined location and orientation, the multi-state magnetic unit comprising:
   a magnetic assembly capable of providing a magnetic field at the exterior surface of the housing that in an absence of the triggering magnetic element is unable to form a magnetic circuit through the housing; and
   a magnetic shield disposed between the magnetic assembly and an interior surface of the housing and having a first side attached to the magnetic assembly and a second side opposite the first side attached to the interior surface of the housing, wherein a triggering magnetic field provided by the triggering magnetic element when located at or near the exterior surface of the housing enables the magnetic assembly to form the magnetic circuit through the housing.

2. The multi-state magnetic unit as recited in claim 1, the magnetic circuit being suitable for magnetically attaching the object to the electronic device.

3. The multi-state magnetic unit as recited in claim 2, the magnetic circuit resulting from the triggering magnetic field interacting with the magnetic field.

4. The multi-state magnetic unit as recited in claim 3, the interaction between the triggering magnetic field and the magnetic field magnetically oversaturates the magnetic shield.

5. The multi-state magnetic unit as recited in claim 1, the magnetic assembly comprising a first magnet and a second magnet each having a first surface having a shape in accordance with the interior surface of the housing.

6. The multi-state magnetic unit as recited in claim 1 further comprising, a magnetic attenuator attached to the magnetic assembly that reduces the magnetic field at the exterior surface of the housing thereby preventing formation of the magnetic circuit.

7. The multi-state magnetic unit as recited in claim 6, the magnetic attenuator being formed of a ferrous material having a first surface attached to the interior surface of the housing and a second surface having a shape in accordance with the surface of the magnetic assembly and attached thereto.

8. The multi-state magnetic unit as recited in claim 7, wherein the magnetic attenuator comprises a ferrous material.

9. The multi-state magnetic unit as recited in claim 8, further comprising a magnetic shunt formed of ferrous material that is disposed on a second surface opposite the surface of the magnetic assembly.

10. The multi-state magnetic unit as recited in claim 9, wherein the magnetic shunt redirects at least some of the magnetic field away from the second surface and towards the interior surface of the housing.

11. The multi-state magnetic unit as recited in claim 1, wherein the multi-state magnetic unit is one of a plurality of multi-state magnetic units attached to the interior surface of the housing.

12. The multi-state magnetic unit as recited in claim 11, wherein the plurality of multi-state magnetic units cooperate to magnetically attach the object to the exterior surface of the housing at the pre-determined location and orientation.

13. The multi-state magnetic unit as recited in claim 1, wherein the electronic device is a tablet device.

14. The multi-state magnetic unit as recited in claim 13, wherein the object is an accessory device.

15. The multi-state magnetic unit as recited in claim 14, wherein the accessory device is a protective cover comprising an attachment mechanism comprising the triggering magnetic element.

16. The multi-state magnetic unit as recited in claim 1, wherein the object is an accessory device.

* * * * *